US011226354B1

(12) United States Patent
Lee et al.

(10) Patent No.: US 11,226,354 B1
(45) Date of Patent: Jan. 18, 2022

(54) PROBE CARD DEVICE AND FENCE-LIKE PROBE THEREOF

(71) Applicant: CHUNGHWA PRECISION TEST TECH. CO., LTD., Taoyuan (TW)

(72) Inventors: Wen-Tsung Lee, New Taipei (TW); Hsun-Tai Wei, Taoyuan (TW); Kai-Chieh Hsieh, Taoyuan (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/020,826

(22) Filed: Sep. 15, 2020

(30) Foreign Application Priority Data

Jul. 15, 2020 (TW) .......................... TW109123884

(51) Int. Cl.
*G01R 1/073* (2006.01)
(52) U.S. Cl.
CPC ................ *G01R 1/07328* (2013.01)
(58) Field of Classification Search
CPC ...... G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392
See application file for complete search history.

(56) References Cited

U.S. PATENT DOCUMENTS

2006/0046528 A1* 3/2006 Beaman ............. H01R 13/2464
439/66
2009/0280676 A1* 11/2009 Weiland ............. G01R 1/07357
439/482

FOREIGN PATENT DOCUMENTS

EP 2107380 A1 * 10/2009 ......... G01R 1/07357
WO WO-2010095521 A * 8/2010 ......... G01R 1/07371

OTHER PUBLICATIONS

English Machine tranlsation of Ishikawa WO 2010095521 (Year: 2010).*

* cited by examiner

*Primary Examiner* — Lee E Rodak
(74) *Attorney, Agent, or Firm* — Li & Cai Intellectual Property Office

(57) ABSTRACT

A probe card device and a fence-like probe thereof are provided. The fence-like probe includes a stroke segment, a fan-out segment, and a testing segment. The stroke segment is in an elongated shape defining a longitudinal direction, and the stroke segment has two end portions and a plurality of penetrating slots that are arranged along a fan-out direction perpendicular to the longitudinal direction, so that the stroke segment is deformable to store an elastic force by being applied with a force. The fan-out segment and the testing segment are respectively connected to the two end portions of the stroke segment. The fan-out segment has a fixing point arranged away from the stroke segment, and the testing segment has an abutting point arranged away from the stroke segment. Along the fan-out direction, the fixing point is spaced apart from the abutting point by a fan-out distance.

9 Claims, 11 Drawing Sheets

PROBE CARD DEVICE AND FENCE-LIKE PROBE THEREOF

CROSS-REFERENCE TO RELATED PATENT APPLICATION

This application claims the benefit of priority to Taiwan Patent Application No. 109123884, filed on Jul. 15, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrically conductive probe, and more particularly to a probe card device and a fence-like probe thereof.

BACKGROUND OF THE DISCLOSURE

A conventional electrically conductive probe has a straight-shaped stroke segment that is bent by being applied with a force so as to provide a stroke. Two opposite ends of the conventional electrically conductive probe are arranged in a direction defined by virtually extending the straight-shaped stroke segment. Due to the structural design of the conventional electrically conductive probe, a space transformer arranged between a circuit board and conventional electrically conductive probes needs to have complex and compact circuits design for transmitting signals between the circuit board and the conventional electrically conductive probes.

SUMMARY OF THE DISCLOSURE

In response to the above-referenced technical inadequacies, the present disclosure provides a probe card device and a fence-like probe thereof to effectively improve on the issues associated with conventional electrically conductive probes.

In one aspect, the present disclosure provides a probe card device, which includes a first guiding board unit, a second guiding board unit, and a plurality of fence-like probes. The first guiding board unit and the second guiding board unit are spaced apart from each other. The fence-like probes pass through the first guiding board unit and the second guiding board unit. Each of the fence-like probes includes a stroke segment, a fan-out segment, and a testing segment. The stroke segment is in an elongated shape defining a longitudinal direction. The stroke segment has two end portions respectively corresponding in position to the first guiding board unit and the second guiding board unit, and the stroke segment has a plurality of penetrating slots arranged along a fan-out direction perpendicular to the longitudinal direction. The fan-out segment is connected to one of the two end portions of the stroke segment. The fan-out segment has a fixing point arranged away from the stroke segment. The testing segment is connected to the other one of the two end portions of the stroke segment. The testing segment protrudes from the second guiding board unit and has an abutting point arranged away from the stroke segment. The fixing point is spaced apart from the abutting point in the fan-out direction by a fan-out distance. In any two of the fence-like probes adjacent to each other, a distance between the two fixing points is larger than a distance between the two abutting points. The first guiding board unit and the second guiding board unit are not staggered with each other, and the stroke segment of each of the fence-like probes is deformable by being applied with a force to store an elastic force.

In another aspect, the present disclosure provides a fence-like probe of a probe card device. The fence-like probe includes a stroke segment, a fan-out segment, and a testing segment. The stroke segment is in an elongated shape defining a longitudinal direction. The stroke segment has two end portions, and the stroke segment has a plurality of penetrating slots arranged along a fan-out direction perpendicular to the longitudinal direction, so that the stroke segment is deformable by being applied with a force to store an elastic force. The fan-out segment is connected to one of the two end portions of the stroke segment. The fan-out segment has a fixing point arranged away from the stroke segment. The testing segment is connected to the other one of the two end portions of the stroke segment. The testing segment has an abutting point arranged away from the stroke segment. The fixing point is spaced apart from the abutting point in the fan-out direction by a fan-out distance.

Therefore, by the structural design of each of the fence-like probes of the present disclosure (e.g., the fixing point and the abutting point are spaced apart from each other by the fan-out distance), the distance between any two of the fixing points of the fence-like probes can be extended, so that the manufacturing cost and efficiency of the probe card device can be effectively improved (e.g., the space transformer can be manufactured more easily; or, the probe card device can be formed without any space transformer).

Specifically, by the structural design of each of the fence-like probes in the present disclosure (e.g., the stroke segment is formed with the penetrating slots arranged along the fan-out direction), the first guiding board unit and the second guiding board unit are not staggered with each other, thereby reducing the length of each of the fence-like probes.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
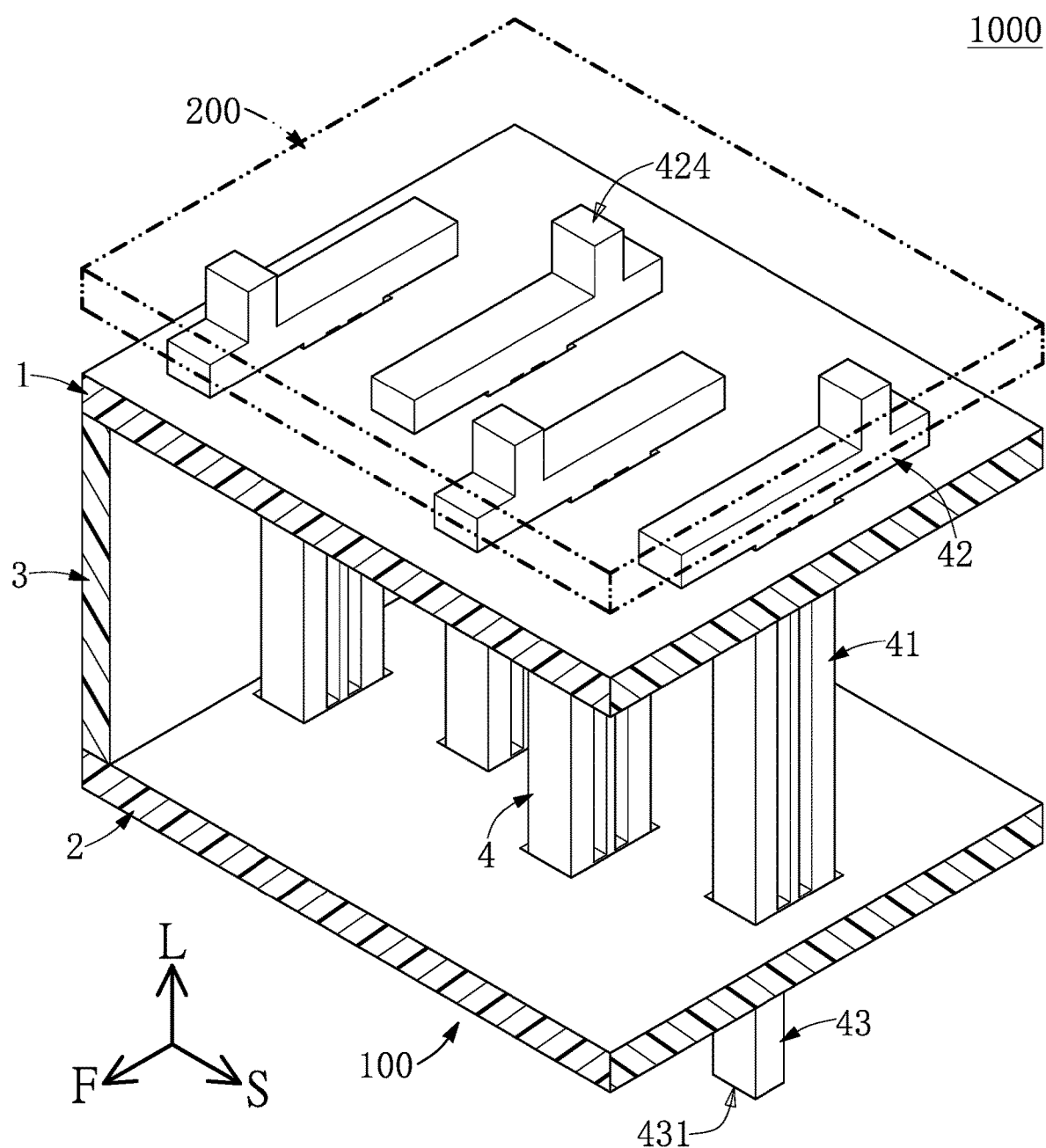
FIG. 1 is a perspective view of a probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 8, a first embodiment of the present disclosure provides a probe card device 1000. As shown in FIG. 1, the probe card device 1000 includes a probe head 100 and a circuit board 200 that is abutted against (or fixed to) one side of the probe head 100 (e.g., the top side of the probe head 100 shown in FIG. 1), and another side of the probe head 100 (e.g., the bottom side of the probe head 100 shown in FIG. 1) is configured to abut against and test a device under test (DUT) that can be a semiconductor wafer (not shown in the drawings). In other words, the probe card device 1000 in the present embodiment does not have any space transformer arranged between the probe head 100 and the circuit board 200, and the probe head 100 is directly connected to (or fixed onto) the circuit board 200.

It should be noted that in order to clearly describe the structure and connection relationship of each component of the probe card device 1000, the drawings of the present embodiment only show a portion of the probe card device 1000, and the present disclosure is not limited to the drawings. The following description describes the structure and connection relationship of each of the probe card devices 1000.

Figure 2:
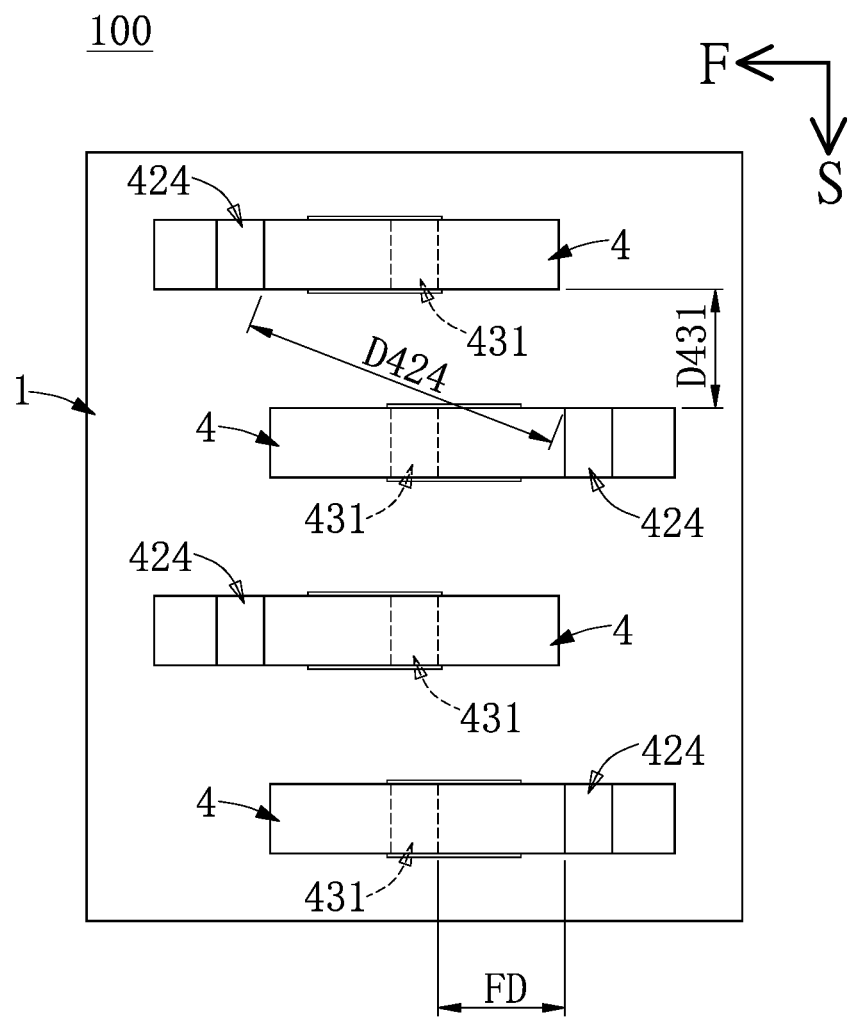
FIG. 2 is a top view showing a probe head of FIG. 1.

As shown in FIG. 1 and FIG. 2, the probe head 100 includes a first guiding board unit 1, and a second guiding board unit 2 spaced apart from the first guiding board unit 1, a spacer 3 sandwiched between the first guiding board unit 1 and the second guiding board unit 2, and a plurality of fence-like probes 4 that pass through the first guiding board unit 1 and the second guiding board unit 2.

It should be noted that the fence-like probes 4 in the present embodiment are described as being in cooperation with the first guiding board unit 1, the second guiding board unit 2, and the spacer 3, but the present disclosure is not limited thereto. For example, in other embodiments of the present disclosure, the fence-like probes 4 can be independently used (e.g., sold) or can be used in cooperation with other components.

In the present embodiment, the first guiding board unit 1 includes one first guiding board, and the second guiding board unit 2 includes one second guiding board. However, in other embodiments of the present disclosure, the first guiding board unit 1 can include a plurality of first guiding boards staggeredly arranged with each other (and a spacing sheet that is sandwiched between two of the first guiding boards adjacent to each other), the second guiding board unit 2 can include a plurality of second guiding boards staggeredly arranged with each other (and a spacing sheet that is sandwiched between two of the second guiding boards adjacent to each other), and the first guiding board unit 1 and the second guiding board unit 2 can be staggeredly arranged with each other (or can be in a staggered arrangement).

It should be noted that by the structural design of each of the fence-like probes 4, the first guiding board unit 1 and the second guiding board unit 2 in the present embodiment are not staggered with each other, thereby reducing the length of each of the fence-like probes 4. In other words, the probe card device 1000 in the present embodiment excludes a staggered arrangement of the first guiding board unit 1 and the second guiding board unit 2.

Moreover, the spacer 3 can be a ring-shaped structure sandwiched between peripheral portions of the first guiding board unit 1 and the second guiding board unit 2, but the present disclosure is not limited thereto. For example, in other embodiments of the present disclosure, the spacer 3 of the probe card device 1000 can be omitted or can be replaced by other components.

As the fence-like probes 4 in the present embodiment are of the substantially same structure, the following description discloses the structure of just one of the fence-like probes 4 for the sake of brevity, but the present disclosure is not limited thereto. For example, in other embodiments of the present disclosure, the fence-like probes 4 can be of different structure.

Figure 3:
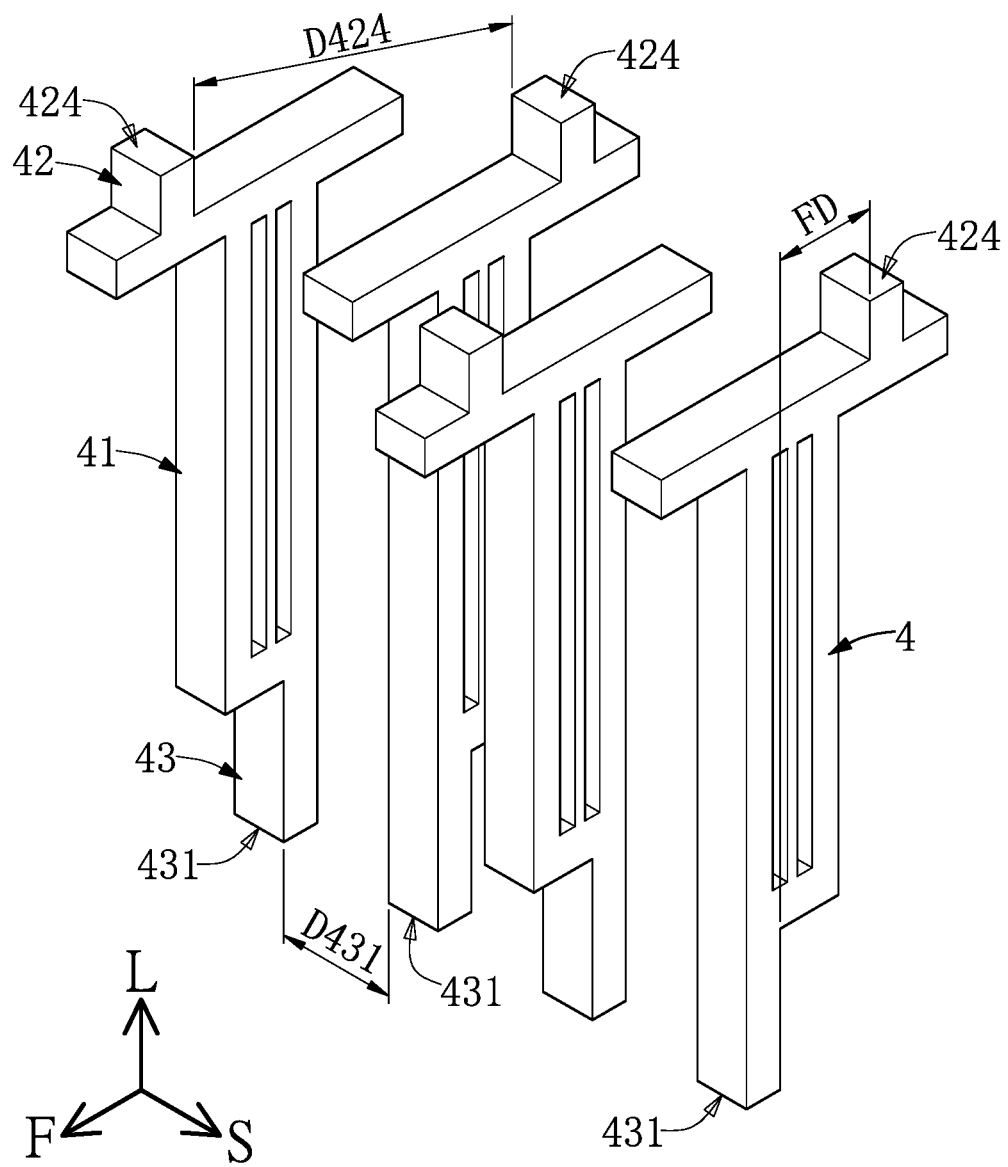
FIG. 3 is a perspective view showing fence-like probes of FIG. 1.
Figure 4:
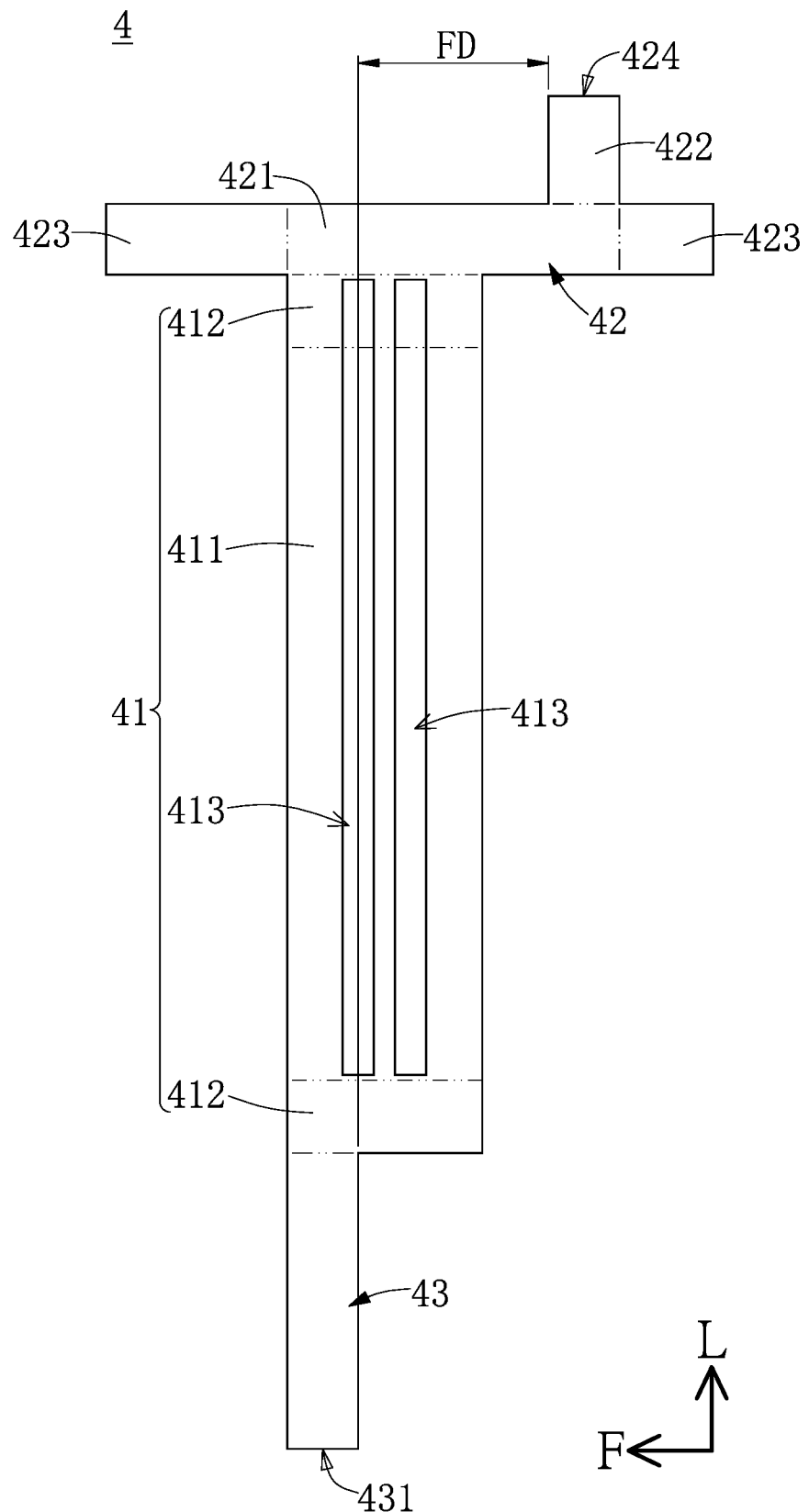
FIG. 4 is a planar view of one of the fence-like probes according to the first embodiment of the present disclosure.

As shown in FIG. 1, FIG. 3, and FIG. 4, the fence-like probe 4 in the present embodiment has a cross section that is in the shape of a rectangle, but the present disclosure is not limited thereto. The fence-like probe 4 includes a stroke segment 41, a fan-out segment 42, and a testing segment 43, the latter two of which are respectively connected to two end portions of the stroke segment 41. The fence-like probe 4 in the present embodiment is integrally formed as a one-piece structure.

The stroke segment 41 in an elongated shape defining a longitudinal direction L. Along a fan-out direction F perpendicular to the longitudinal direction L, a width of the stroke segment 41 is smaller than a width of the fan-out segment 42 and is larger than a width of the testing segment 43. The stroke segment 41 includes a deformable portion 411 and two end portions 412 that are respectively connected to two ends of the deformable portion 411. The two end portions 412 respectively correspond in position to the first guiding board unit 1 and the second guiding board unit 2. For example, one of the two end portions 412 located at the upper side is arranged in the first guiding board unit 1, and the other one of the two end portions 412 located at the lower side is arranged adjacent to or abutted against the second guiding board unit 2.

Moreover, the stroke segment 41 has a plurality of penetrating slots 413 arranged along the fan-out direction F so as to be formed in a fence-like shape. Each of the penetrating slots 413 extends from one of the two end portions 412 toward the other one of the two end portions 412 along the longitudinal direction L. In other words, any one of the penetrating slots 413 in the present embodiment is located at the deformable portion 411 and one of the two end portions 412 that is connected to the fan-out segment 42, but the present disclosure is not limited thereto. For example, in other embodiments of the present disclosure, any one of the penetrating slots 413 can be only formed in the deformable portion 411.

Figure 6:
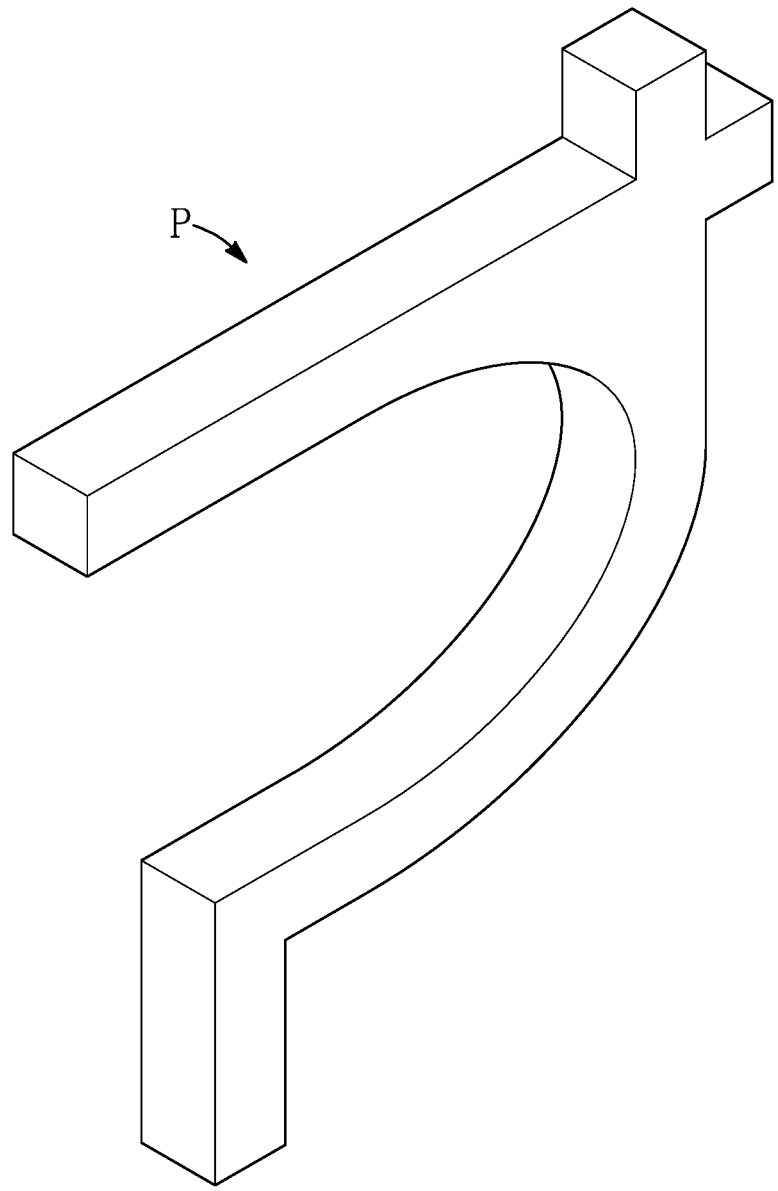
FIG. 6 is a perspective view showing an electrically conductive probe that is shown to compare with the fence-like probe of the first embodiment of the present disclosure.

Accordingly, since the stroke segment 41 of the fence-like probe 4 is formed with the penetrating slots 413, the stroke segment 41 by being applied with a force is deformable to store an elastic force. In other words, any electrically conductive probe P (as shown in FIG. 6) provided without penetrating slots along the fan-out direction is different from the fence-like probe 4 of the present embodiment.

The fan-out segment 42 and the testing segment 43 in the present embodiment respectively extend from the two end portions 412. Specifically, a projection space defined by orthogonally projecting the testing segment 43 toward the fan-out segment 42 only covers at most 50% of (volume of) one of the penetrating slots 413, so that the testing segment 43 and the fan-out segment 42 can be supported by a part of the stroke segment 41, and the structural strength of the fence-like probe 4 can be maintained, but the present disclosure is not limited thereto. For example, in other embodiments of the present disclosure, a projection space defined by orthogonally projecting the testing segment 43 toward the fan-out segment 42 can also not cover any of the penetrating slots 413.

The fan-out segment 42 protrudes from the first guiding board unit 1 and has a fixing point 424 arranged away from the stroke segment 41. The testing segment 43 protrudes from the second guiding board unit 2 and has an abutting point 431 arranged away from the stroke segment 41. Moreover, the fixing point 424 is spaced apart from the abutting point 431 in the fan-out direction F by a fan-out distance FD. The fan-out distance FD can be adjusted or changed according to design requirements, and is not limited to the present embodiment.

Specifically, the fan-out segment 42 in the present embodiment includes an extending portion 421, a fixing portion 422, and two wing portions 423, the latter two of which are connected to the extending portion 421. The extending portion 421 extends from the corresponding end portion 412 of the stroke segment 41 along the fan-out direction F, and a width of the extending portion 421 in the fan-out direction F is preferably greater than the width of the stroke segment 41, but the present disclosure is not limited thereto. The fixing portion 422 extends from the extending portion 421 along the longitudinal direction L away from the stroke segment 41, and a free end of the fixing portion 422 is defined as the fixing point 424. Furthermore, a length of the extending portion 421 in the fan-out direction F can be adjusted or changed according to design requirements, thereby effectively changing the fan-out distance FD between the fixing point 424 and the abutting point 431.

Figure 5A:
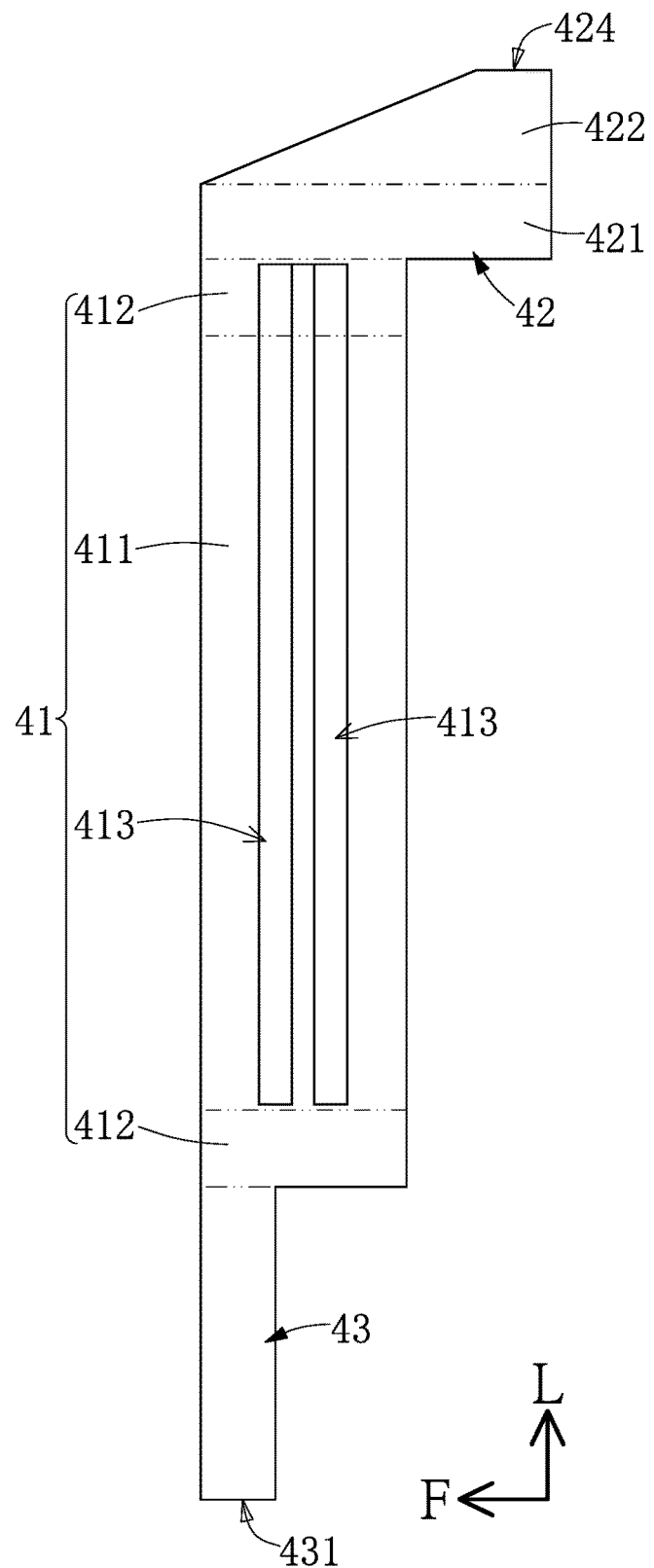
FIG. 5A is a planar view showing the fence-like probe in another configuration according to the first embodiment of the present disclosure.

Moreover, the fixing portion 422 substantially and perpendicularly extends from an end of the extending portion 421 (e.g., the right end of the extending portion 421 shown in FIG. 4) away from the stroke segment 41, but the present disclosure is not limited thereto. For example, as shown in FIG. 5A, the fixing portion 422 can be gradually tapered from a top side of the extending portion 421 along the longitudinal direction L, so that the fixing portion 422 can be formed in a substantial trapezoid.

Figure 5B:
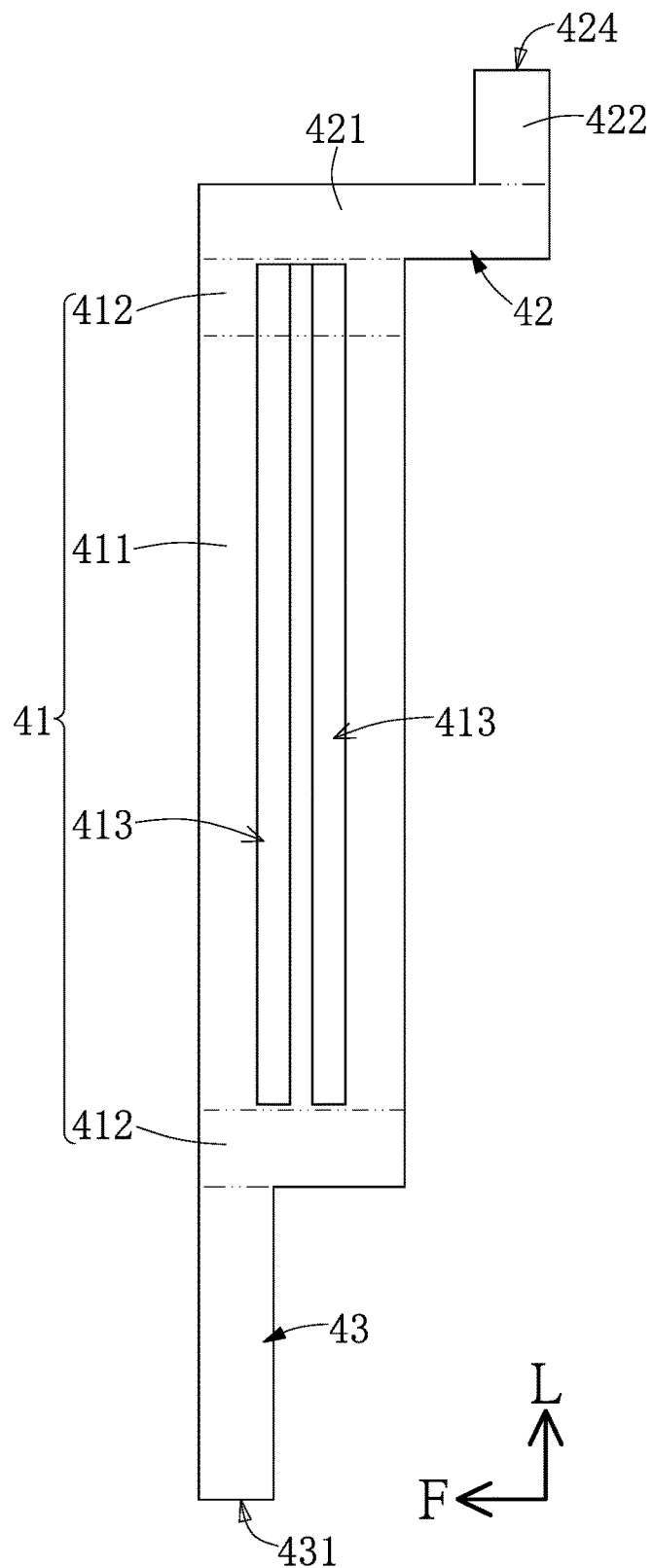
FIG. 5B is a planar view showing the fence-like probe in still another configuration according to the first embodiment of the present disclosure.

In addition, the two wing portions 423 respectively extend from two opposite ends of the extending portion 421 along the fan-out direction F away from each other, and the two wing portions 423 respectively protrude from the corresponding end portion 412 of the stroke segment 41 and the fixing portion 422. It should be noted that the fan-out segment 42 shown in FIG. 4 includes the two wing portions 423, but the present disclosure is not limited thereto. For example, as shown in FIG. 5A and FIG. 5B, the fan-out segment 42 can be formed without the two wing portions 423; or, in other embodiments of the present disclosure, the fan-out segment 42 can be formed without any one of the two wing portions 423.

Moreover, the penetrating slots 413 of the stroke segment 41 in the present embodiment are substantially arranged at one side of the testing segment 43 adjacent to the fixing portion 422 (e.g., the right side of the testing segment 43), but the present disclosure is not limited thereto. For example, in other embodiments of the present disclosure, the penetrating slots 413 can be arranged at one side of the testing segment 43 away from the fixing portion 422, or can be respectively arranged at two opposite sides of the testing segment 43.

The above description describes the structure of one of the fence-like probes 4, and the following description describes the connection relationship between the fence-like probes 4 and other components. As shown in FIG. 1, FIG. 3, and FIG. 4, by the structural design of each of the fence-like probes 4 (e.g., the fixing point 424 and the abutting point 431 are spaced apart from each other by the fan-out distance FD), the distance between any two of the fixing points 431 of the fence-like probes 4 can be extended (e.g., in any two of the fence-like probes 4 adjacent to each other, a distance D424 between the two fixing points 424 is larger than a distance D431 between the two abutting points 431), and the probe head 100 can be directly fixed onto the circuit board 200 (i.e., the probe card device 1000 can be formed without any space transformer). Accordingly, the manufacturing cost and efficiency of the probe card device 1000 can be effectively improved.

Specifically, the abutting points 431 of the fence-like probes 4 in the present embodiment are arranged in N number of rows (e.g., N is a positive integer that is equal to or less than three) each parallel to a straight direction S that is perpendicular to the longitudinal direction L and the fan-out direction F. In other words, the probe card device 1000 of the present embodiment is preferably used to test a DUT that is a chip in peripheral type, but the present disclosure is not limited thereto. For example, in other embodiments of the present disclosure, the arrangement of the abutting points 431 of the fence-like probes 4 can be adjusted or changed according to design requirements.

Figure 7:
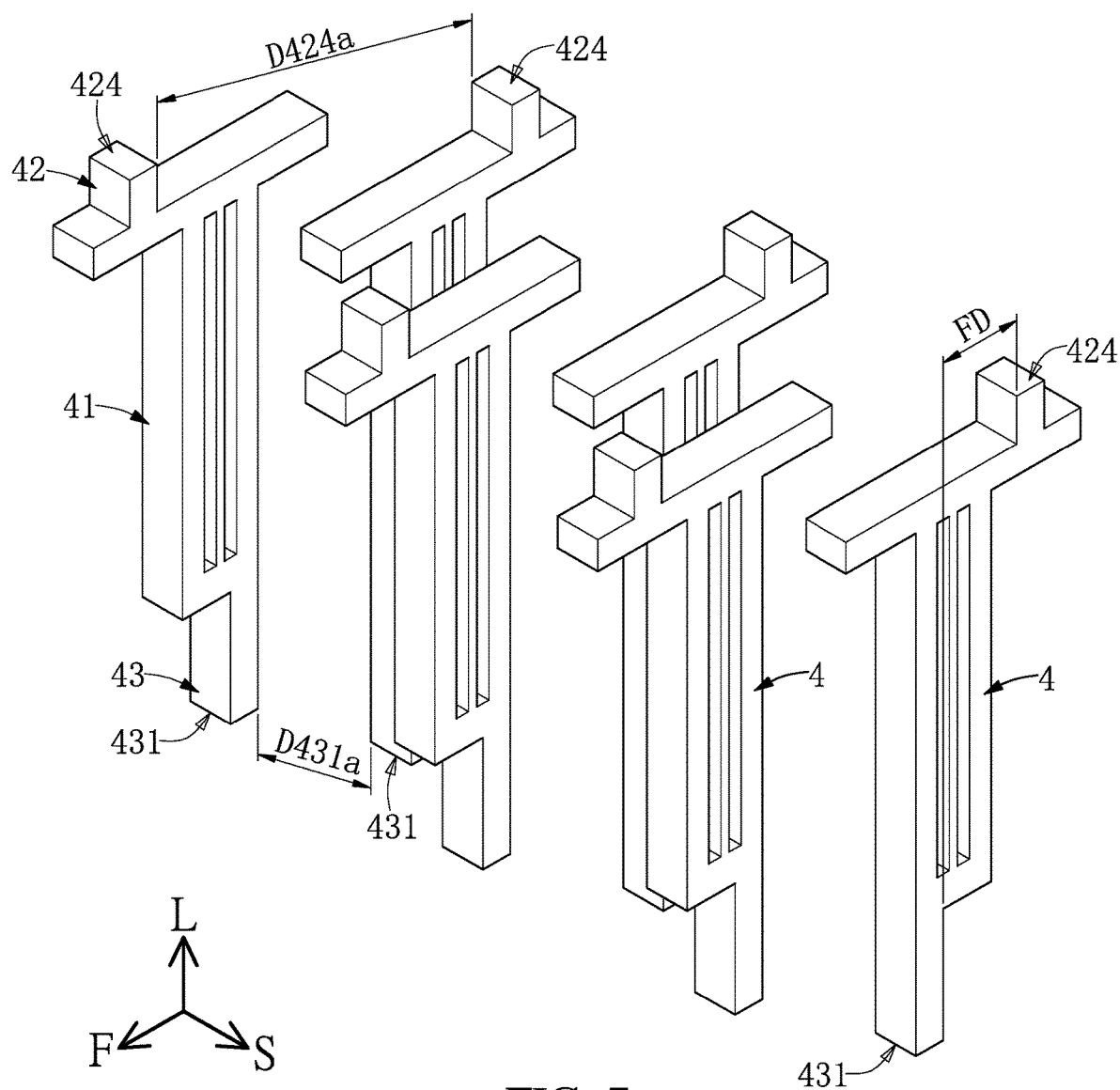
FIG. 7 is a perspective view showing the fence-like probes of the probe card device in another configuration according to the first embodiment of the present disclosure.
Figure 8:
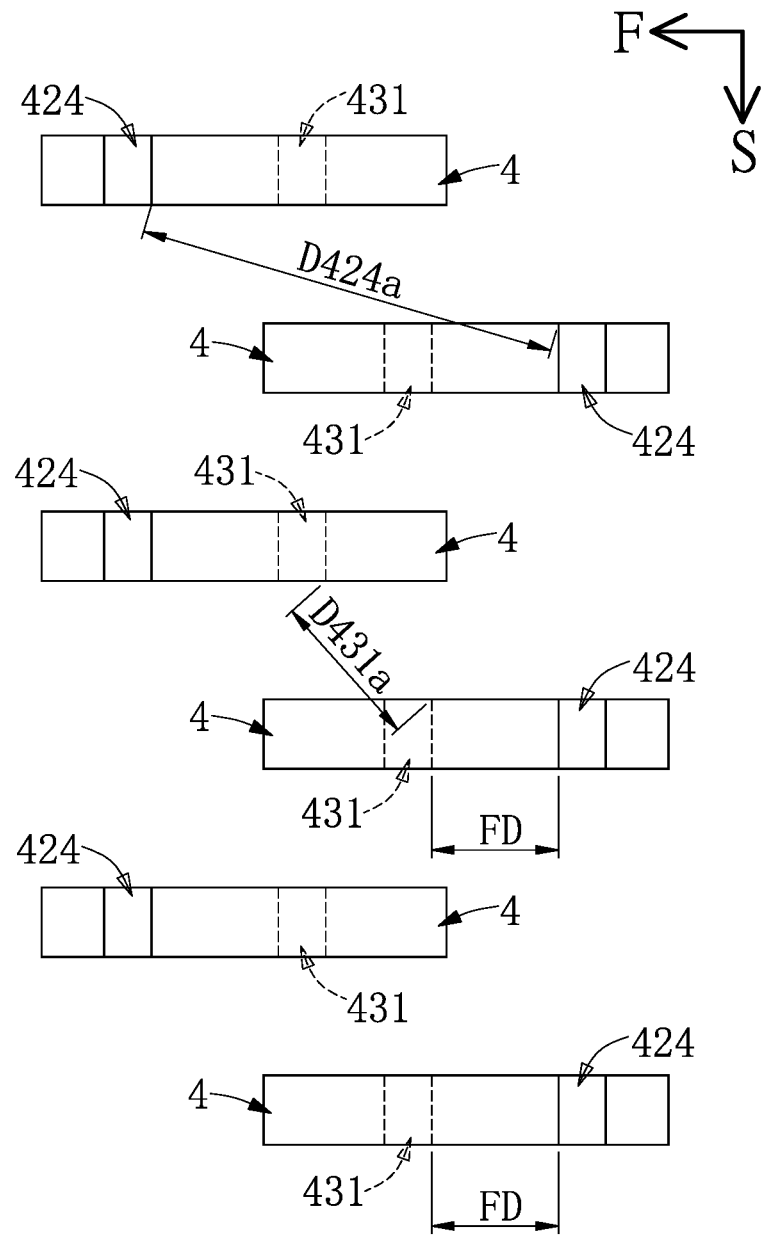
FIG. 8 is a top view of FIG. 7.

Moreover, in order to clearly explain the above features, the following description describes some examples when N is one or two. As shown in FIG. 3, the abutting points 431 of the fence-like probes 4 are arranged in one row parallel to the straight direction S, and the fixing points 431 of the fence-like probes 4 are staggeredly arranged. Or, as shown in FIG. 7 and FIG. 8, the abutting points 431 of the fence-like probes 4 are arranged in two rows each parallel to the straight direction S, and in any two of the fence-like probes 4 adjacent to each other and respectively belonging to the two rows, a distance D431a between the two abutting points 431 is less than a distance D424a between the two fixing points 424.

Second Embodiment

Figure 9:
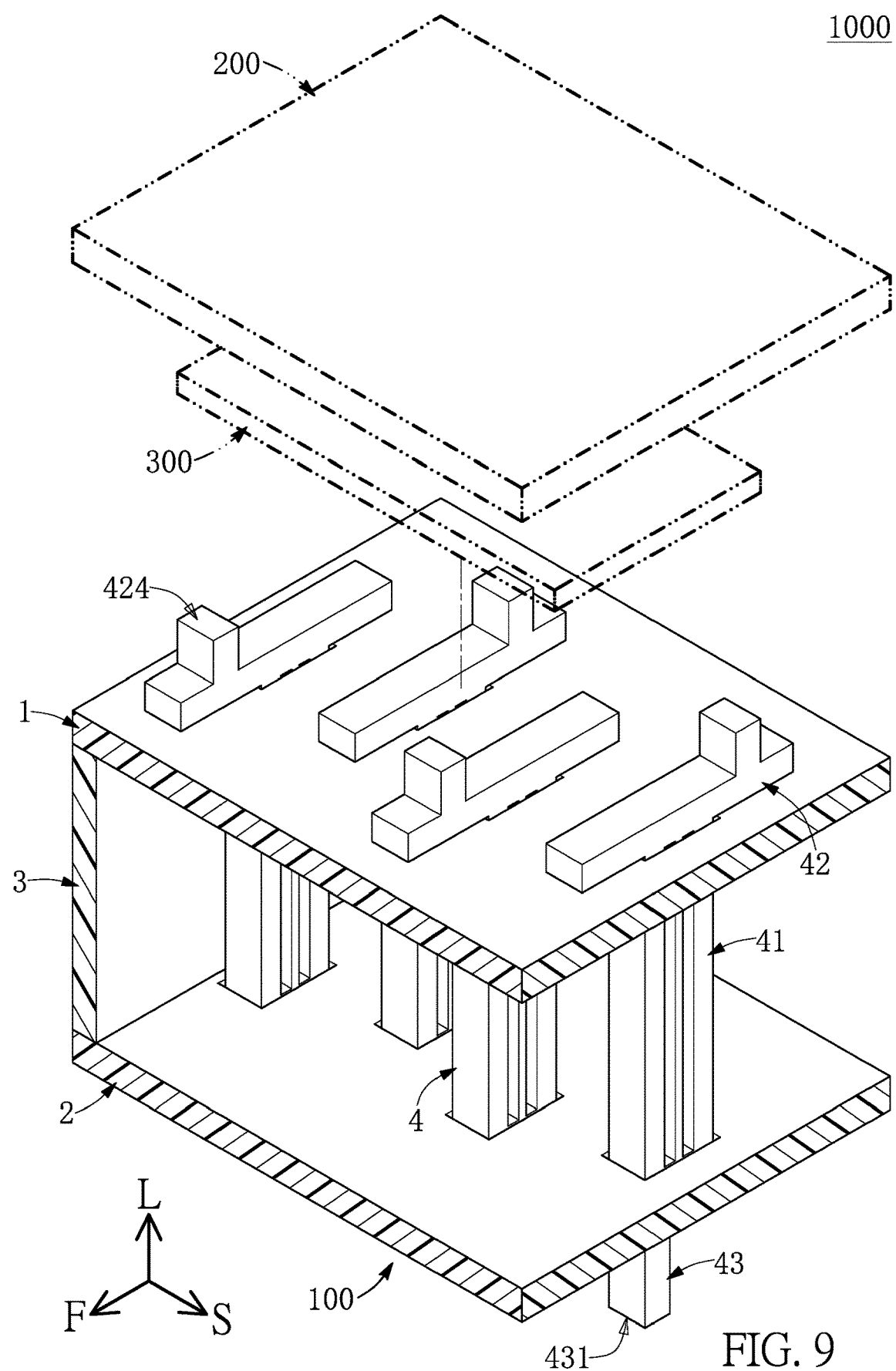
FIG. 9 is a perspective view of a probe card device according to a second embodiment of the present disclosure.

Referring to FIG. 9, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, the probe card device 1000 further includes a space transformer 300 that connects the circuit board 200 and the fence-like probes 4. Each of the fence-like probes 4 is fixed onto the space transformer 300 through the fixing point 424 thereof. In other words, the fence-like probes 4 in the present embodiment are electrically coupled to the circuit board 200 through the space transformer 300.

Accordingly, by the structural design of each of the fence-like probes 4 (e.g., the fixing point 424 and the abutting point 431 are spaced apart from each other by the fan-out distance FD), the distance between any two of the fixing points 431 of the fence-like probes 4 can be extended, thereby effectively making the manufacturing of the space transformer 300 more easy.

Third Embodiment

Figure 10:
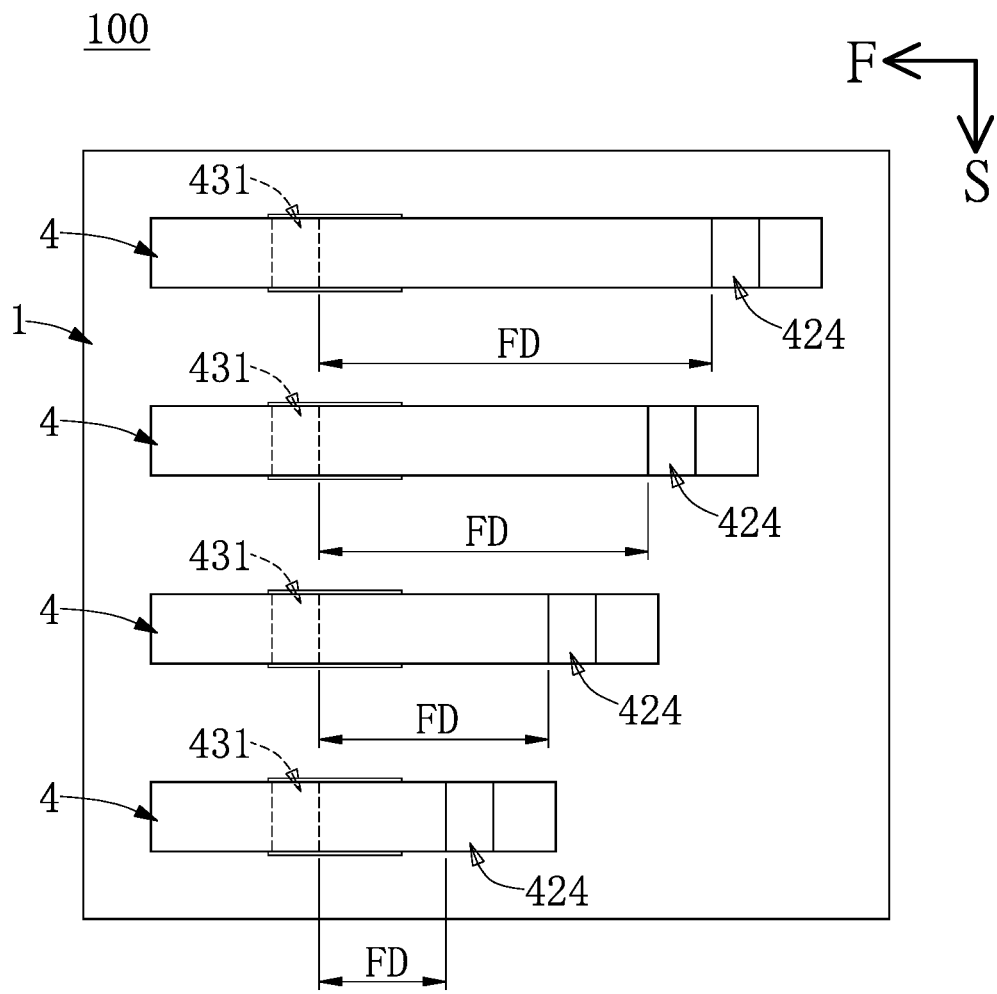
FIG. 10 is a perspective view of a probe head according to a third embodiment of the present disclosure.

Referring to FIG. 10, a third embodiment of the present disclosure is similar to the first and second embodiments of the present disclosure. For the sake of brevity, descriptions of the same components in the first to third embodiments of the present disclosure will be omitted herein, and the following description only discloses different features between the third embodiment and the first and second embodiments.

In the present embodiment, the fan-out distances FD of the fence-like probes 4 include at least two different values. In other words, the probe head 100 is provided with the fence-like probes 4 having the fan-out distances FD of different values, thereby satisfying different design requirements and allowing the fixing points 424 of the fence-like probes 4 to be directly fixed onto a circuit board (not shown in FIG. 10). In other words, the fence-like probes 4 in the present embodiment can be formed to have the fan-out distances FD of different values so as to replace a space transformer.

In conclusion, by the structural design of each of the fence-like probes of the present disclosure (e.g., the fixing point and the abutting point are spaced apart from each other by the fan-out distance), the distance between any two of the fixing points of the fence-like probes can be extended, so that the manufacturing cost and efficiency of the probe card device can be effectively improved (e.g., the space transformer can be manufactured more easily; or, the probe card device can be formed without any space transformer).

Specifically, by the structural design of each of the fence-like probes in the present disclosure (e.g., the stroke segment is formed with the penetrating slots arranged along the fan-out direction), the first guiding board unit and the second guiding board unit are not staggered with each other, thereby reducing the length of each of the fence-like probes.

Moreover, the probe head in the present disclosure is provided with the fence-like probes having the fan-out distances of different values, thereby allowing the fixing points of the fence-like probes to be directly fixed onto a circuit board (i.e., the probe card device can be formed without any space transformer).

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A probe card device, comprising:
a first guiding board unit and a second guiding board unit that are spaced apart from each other; and
a plurality of fence-like probes passing through the first guiding board unit and the second guiding board unit, wherein each of the fence-like probes includes:
a stroke segment being in an elongated shape defining a longitudinal direction, wherein the stroke segment has two end portions respectively corresponding in position to the first guiding board unit and the second guiding board unit, and the stroke segment has a plurality of penetrating slots arranged along a fan-out direction perpendicular to the longitudinal direction;
a fan-out segment connected to one of the two end portions of the stroke segment, wherein the fan-out segment has a fixing point arranged away from the stroke segment; and
a testing segment connected to the other one of the two end portions of the stroke segment, wherein the testing segment protrudes from the second guiding board unit and has an abutting point arranged away from the stroke segment, and wherein the fixing point is spaced apart from the abutting point in the fan-out direction by a fan-out distance,
wherein in any two of the fence-like probes adjacent to each other, a distance between the two fixing points is larger than a distance between the two abutting points, and wherein the first guiding board unit and the second guiding board unit are not staggered with each other, and the stroke segment of each of the fence-like probes is deformable by being applied with a force to store an elastic force;

wherein in each of the fence-like probes, a projection space defined by orthogonally projecting the testing segment toward the fan-out segment only covers at most 50% of the penetrating slots.

2. The probe card device according to claim 1, further comprising a circuit board, wherein the fixing points of the fence-like probes are fixed onto the circuit board.

3. The probe card device according to claim 1, wherein the abutting points of the fence-like probes are arranged in one row parallel to a straight direction that is perpendicular to the longitudinal direction and the fan-out direction, and the fixing points of the fence-like probes are staggeredly arranged.

4. The probe card device according to claim 1, wherein the abutting points of the fence-like probes are arranged in two rows each parallel to a straight direction that is perpendicular to the longitudinal direction and the fan-out direction, and wherein in any two of the fence-like probes adjacent to each other and respectively belonging to the two rows, a distance between the two abutting points is less than a distance between the two fixing points.

5. The probe card device according to claim 1, wherein in each of the fence-like probes, each of the penetrating slots extends from one of the two end portions toward the other one of the two end portions along the longitudinal direction.

6. The probe card device according to claim 1, wherein the fan-out distances of the fence-like probes include at least two different values.

7. The probe card device according to claim 1, wherein the fan-out segment of each of the fence-like probes includes:
   an extending portion extending from the corresponding end portion of the stroke segment along the fan-out direction;
   a fixing portion extending from the extending portion along the longitudinal direction, wherein a free end of the fixing portion is defined as the fixing point; and
   two wing portions respectively extending from two opposite ends of the extending portion along the fan-out direction, wherein the two wing portions respectively protrude from the corresponding end portion of the stroke segment and the fixing portion.

8. A fence-like probe of a probe card device, comprising:
   a stroke segment being in an elongated shape defining a longitudinal direction, wherein the stroke segment has two end portions, and the stroke segment has a plurality of penetrating slots arranged along a fan-out direction perpendicular to the longitudinal direction, so that the stroke segment is deformable to store an elastic force by being applied with a force;
   a fan-out segment connected to one of the two end portions of the stroke segment, wherein the fan-out segment has a fixing point arranged away from the stroke segment; and
   a testing segment connected to the other one of the two end portions of the stroke segment, wherein the testing segment has an abutting point arranged away from the stroke segment, and wherein the fixing point is spaced apart from the abutting point in the fan-out direction by a fan-out distance;
   wherein a projection space defined by orthogonally projecting the testing segment toward the fan-out segment only covers at most 50% of one of the penetrating slots.

9. The fence-like probe according to claim 8, wherein the fan-out segment includes:
   an extending portion extending from the corresponding end portion of the stroke segment along the fan-out direction;
   a fixing portion extending from the extending portion along the longitudinal direction, wherein a free end of the fixing portion is defined as the fixing point; and
   two wing portions respectively extending from two opposite ends of the extending portion along the fan-out direction, wherein the two wing portions respectively protrude from the corresponding end portion of the stroke segment and the fixing portion.

\* \* \* \* \*